(12) United States Patent
Hoehn

(10) Patent No.: US 11,107,739 B2
(45) Date of Patent: Aug. 31, 2021

(54) POWER SEMICONDUCTOR MODULE ARRANGEMENT

(71) Applicant: Infineon Technologies AG, Neubiberg (DE)

(72) Inventor: Alexander Hoehn, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/867,187

(22) Filed: May 5, 2020

(65) Prior Publication Data

US 2020/0357711 A1    Nov. 12, 2020

(30) Foreign Application Priority Data

May 6, 2019   (EP) ..................................... 19172721

(51) Int. Cl.
| | |
|---|---|
| *H01L 23/00* | (2006.01) |
| *H01L 23/057* | (2006.01) |
| *H01L 25/07* | (2006.01) |

(52) U.S. Cl.
CPC ............ *H01L 23/057* (2013.01); *H01L 24/48* (2013.01); *H01L 25/072* (2013.01); *H01L 2224/48225* (2013.01); *H01L 2924/13055* (2013.01); *H01L 2924/13062* (2013.01); *H01L 2924/13064* (2013.01); *H01L 2924/13091* (2013.01)

(58) Field of Classification Search
CPC ................. H01L 23/057; H01L 25/072; H01L 2224/48225; H01L 2924/13055; H01L 2924/13062; H01L 2924/13064; H01L 2924/13091

USPC ......................................................... 257/694
See application file for complete search history.

(56) References Cited

U.S. PATENT DOCUMENTS

| | | |
|---|---|---|
| 5,751,058 A | 5/1998 | Matsuki |
| 10,008,392 B2 | 6/2018 | Hoehn et al. |
| 10,020,237 B2 | 7/2018 | Hoehn et al. |
| 2007/0187817 A1 | 8/2007 | Popp |
| 2010/0065962 A1 | 3/2010 | Bayerer et al. |
| 2011/0273861 A1 | 11/2011 | Matsumoto et al. |
| 2013/0056883 A1 | 3/2013 | Furukawa |
| 2013/0277819 A1 | 10/2013 | Yoshida |
| 2016/0254255 A1 | 9/2016 | Hori et al. |

(Continued)

FOREIGN PATENT DOCUMENTS

| | | |
|---|---|---|
| EP | 2816599 A2 | 12/2014 |
| JP | 2003068979 A | 3/2003 |

(Continued)

*Primary Examiner* — Elias Ullah
(74) *Attorney, Agent, or Firm* — Murphy, Bilak & Homiller, PLLC

(57) ABSTRACT

A power semiconductor module arrangement includes a first switching element and a second switching element, each having a control terminal and a controllable load path between two load terminals, the load paths being operatively coupled in series and between a first supply node, and a second supply node. The switching elements are connected with each other via a first common node. An output node configured to be coupled to an output potential is coupled to the first common node. The first supply node is formed by a plurality of first terminals, the second supply node is formed by a plurality of second terminals, and the output node is formed by a plurality of third terminals. The switching elements are arranged inside a housing.

11 Claims, 3 Drawing Sheets

(56) References Cited

U.S. PATENT DOCUMENTS

2017/0125322 A1 5/2017 Spann et al.
2018/0138100 A1 5/2018 Iwahashi

FOREIGN PATENT DOCUMENTS

WO 2015176985 A1 11/2015
WO 2018202620 A1 11/2018

POWER SEMICONDUCTOR MODULE ARRANGEMENT

TECHNICAL FIELD

The instant disclosure relates to a power semiconductor module arrangement.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

Electrical lines or electrical connections are used to connect different semiconductor devices of the power semiconductor arrangement with each other. Further, terminal elements are provided to contact the semiconductor arrangement from outside the housing. Such terminal elements are usually electrically coupled to the first metallization layer with a first end. A second end of the terminal elements protrudes outside the housing. The layout of the power semiconductor module arrangement, in particular the positioning of the second ends or the terminal elements may have an impact on the switching characteristics of the semiconductor arrangement.

There is a need for a power semiconductor module arrangement with improved switching characteristics wherein the requirements on creepage distances are met.

SUMMARY

A power semiconductor module arrangement includes a first switching element and a second switching element, each having a control terminal and a controllable load path between two load terminals, the load paths of the first switching element and the second switching element being operatively coupled in series and between a first supply node which is configured to be operatively coupled to a first electrical potential, and a second supply node which is configured to be operatively coupled to a second electrical potential, wherein the first switching element and the second switching element are connected with each other via a first common node. The power semiconductor module arrangement further comprises an output node which is configured to be coupled to an output potential. The output node is coupled to the first common node. The first supply node is formed by a plurality of first terminals, the second supply node is formed by a plurality of second terminals, and the output node is formed by a plurality of third terminals. A first auxiliary emitter terminal of the first switching element is electrically coupled to the control terminal of the first switching element, and a second auxiliary emitter terminal of the second switching element is electrically coupled to the control terminal of the second switching element. The first switching element and the second switching element are arranged inside a housing, the housing comprising a first longitudinal side, a second longitudinal side, a first narrow side, and a second narrow side. The first terminals are at least partly arranged in a first section of the housing adjacent to the first narrow side, the third terminals, the first control terminal, a first emitter terminal and the first auxiliary emitter terminal are arranged in a third section of the housing adjacent to the second narrow side, and the second terminals, the second control terminal, a second emitter terminal, and the second auxiliary emitter terminal are arranged in a second section of the housing, wherein the second section is arranged between the first section and the third section.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
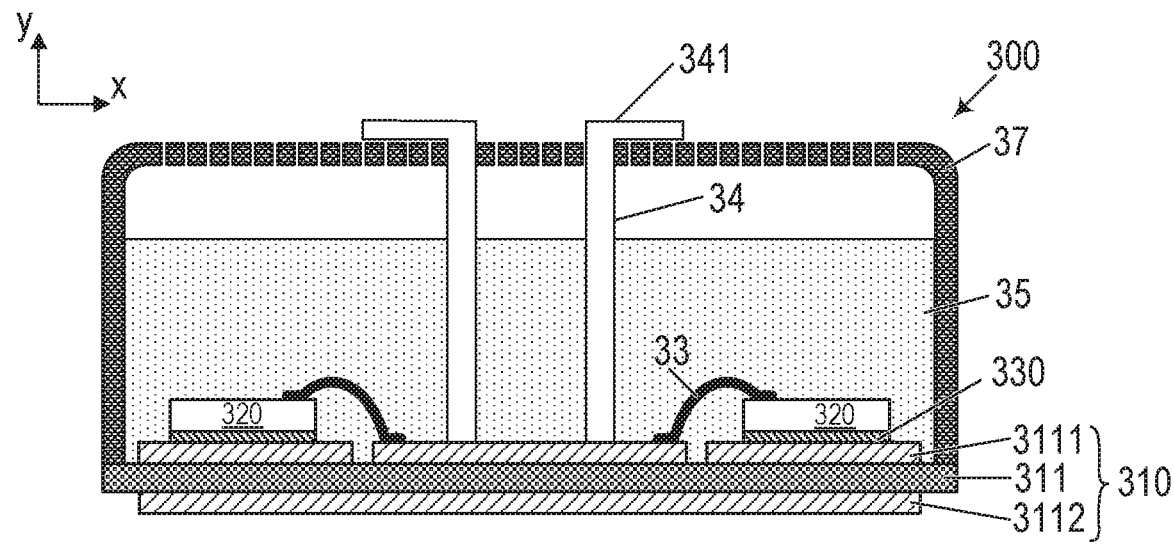
FIG. 1 is a cross-sectional view of a power semiconductor module arrangement.

Referring to FIG. 1, a cross-sectional view of a power semiconductor module arrangement 300 is schematically illustrated. The power semiconductor module arrangement 300 includes a housing 37 and a semiconductor substrate 310. The semiconductor substrate 310 includes a dielectric insulation layer 311, a (structured) first metallization layer 3111 attached to the dielectric insulation layer 311, and a second (structured) metallization layer 3112 attached to the dielectric insulation layer 311. The dielectric insulation layer 311 is disposed between the first and second metallization layers 3111, 3112.

Each of the first and second metallization layers 3111, 3112 may consist of or include one of the following materials: copper; a copper alloy; aluminum; an aluminum alloy; any other metal or alloy that remains solid during the operation of the power semiconductor module arrangement. The semiconductor substrate 310 may be a ceramic substrate, that is, a substrate in which the dielectric insulation layer 311 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 310 may, e.g., be a Direct Copper Bonding (DCB) substrate, a Direct Aluminum Bonding (DAB) substrate, or an Active Metal Brazing (AMB) substrate. Further, the substrate 310 may be an Insulated Metal Substrate (IMS). An Insulated Metal Substrate generally comprises a dielectric insulation layer 311 comprising (filled) materials such as epoxy resin or polyimide, for example. The material of the dielectric insulation layer 311 may be filled with ceramic particles, for example. Such particles may comprise, e.g., $Si_2O$, $Al_2O_3$, AlN, or BrN and may have a diameter of between about 1 μm and about 50 μm. The substrate 310 may also be a conventional printed circuit board (PCB) having a non-ceramic dielectric insulation layer 311. For instance, a non-ceramic dielectric insulation layer 311 may consist of or include a cured resin.

The semiconductor substrate 310 is arranged in a housing 37. In the example illustrated in FIG. 1, the semiconductor substrate 310 forms a ground surface of the housing 37, while the housing 37 itself solely comprises sidewalls and a cover. This is, however, only an example. It is also possible that the housing 37 further comprises a ground surface and the semiconductor substrate 310 be arranged inside the housing 37. According to another example, the semiconductor substrate 310 may be mounted on a base plate (not illustrated). In some power semiconductor module arrangements 300, more than one semiconductor substrate 310 is arranged on the ground surface of a housing 37 or on a single base plate (not illustrated). The base plate may form a ground surface of the housing 37, for example.

One or more semiconductor bodies 320 may be arranged on the at least one semiconductor substrate 310. Each of the semiconductor bodies 320 arranged on the at least one semiconductor substrate 310 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 320 may form a semiconductor arrangement on the semiconductor substrate 310. In FIG. 1, only two semiconductor bodies 320 are exemplarily illustrated. The second metallization layer 3112 of the semiconductor substrate 310 in FIG. 1 is a continuous layer. The first metallization layer 3111 is a structured layer in the example illustrated in FIG. 1. "Structured layer" means that the first metallization layer 3111 is not a continuous layer, but includes recesses between different sections of the layer. Such recesses are schematically illustrated in FIG. 1. The first metallization layer 3111 in this example includes three different sections. This, however, is only an example. Any other number of sections is possible. Different semiconductor bodies 320 may be mounted to the same or to different sections of the first metallization layer 3111. Different sections of the first metallization layer may have no electrical connection or may be electrically connected to one or more other sections using, e.g., bonding wires 33. Electrical connections 33 may also include connection plates or conductor rails, for example, to name just a few examples. The one or more semiconductor bodies 320 may be electrically and mechanically connected to the semiconductor substrate 310 by an electrically conductive connection layer 330. Such an electrically conductive connection layer may be a solder layer, a layer of an electrically conductive adhesive, or a layer of a sintered metal powder, e.g., a sintered silver powder, for example.

According to other examples, it is also possible that the second metallization layer 3112 is a structured layer. It is further possible to omit the second metallization layer 3112 altogether. It is also possible that the first metallization layer 3111 is a continuous layer, for example.

The power semiconductor module arrangement 300 illustrated in FIG. 1 further includes terminal elements 34. The terminal elements 34 are electrically connected to the first metallization layer 3111 and provide an electrical connection between the inside and the outside of the housing 37. The terminal elements 34 may be electrically connected to the first metallization layer 3111 with a first end, while a second end 341 of the terminal elements 34 protrudes out of the housing 37. The terminal elements 34 may be electrically contacted from the outside at their second end 341. A first part of the terminal elements 34 may extend through the inside of the housing 37 in a vertical direction y. The vertical direction y is a direction perpendicular to a top surface of the semiconductor substrate 310, wherein the top surface of the semiconductor substrate 310 is a surface on which the at least one semiconductor body 320 is mounted. The second ends 341 of the terminal elements 34 may be bent such that they extend in a first horizontal direction x which is parallel to the top surface of the semiconductor substrate 310. In this way, for some applications it may be easier to electrically contact the second ends 341. The terminal elements 34 illustrated in FIG. 1, however, are only examples. Terminal elements 34 may be implemented in any other way and may be arranged anywhere within the housing 37. For example, one or more terminal elements 34 may be arranged close to or adjacent to the sidewalls of the housing 37. Terminal elements 34 could also protrude through the sidewalls of the housing 37 instead of through the cover. It is also possible that the second ends 341 completely extend in the vertical direction y instead of being bent in the first horizontal direction x. Any other suitable implementation is possible.

The semiconductor bodies 320 each may include a chip pad metallization (not specifically illustrated), e.g., a source, drain, anode, cathode or gate metallization. A chip pad metallization generally provides a contact surface for electrically connecting the semiconductor body 320. The chip pad metallization may electrically contact a connection layer 330, a terminal element 34, or an electrical connection 33, for example. A chip pad metallization may consist of or include a metal such as aluminum, copper, gold or silver, for example. The electrical connections 33 and the terminal elements 34 may also consist of or include a metal such as copper, aluminum, gold, or silver, for example.

Figure 2:
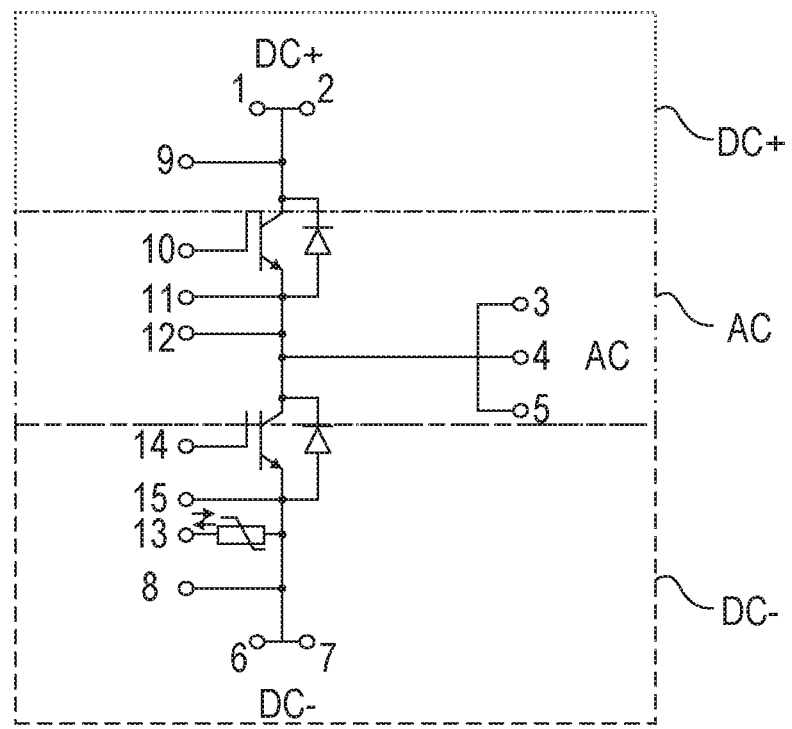
FIG. 2 schematically illustrates a circuit arrangement according to one example.

Now referring to FIG. 2 and as has been mentioned above, the at least two semiconductor bodies 320 may be arranged in a half-bridge configuration. FIG. 2 is a circuit diagram of an exemplary half-bridge arrangement.

The half-bridge arrangement is configured to convert a DC voltage provided at an input DC+, DC− of the half-bridge arrangement into an AC voltage. The AC voltage may be provided to, e.g., a load (not illustrated), that is coupled to an output AC of the half-bridge arrangement. The half-bridge arrangement is coupled between a first supply node 1, 2, 9 which is configured to be operatively coupled to a first electrical potential DC+ and a second supply node 6, 7, 8 which is configured to be operatively coupled to a second electrical potential DC−. The first electrical potential DC+ may be a positive potential and the second electrical potential DC− may be a negative potential to supply a DC voltage via the first and second supply nodes 1, 2, 9, 6, 7, 8. The first and second supply nodes 1, 2, 9, 6, 7, 8 form the input of the half-bridge arrangement.

The half-bridge may include one high-side switch S1 (first switch) and one low-side switch S2 (second switch) coupled in series to each other between the first supply node 1, 2, 9 and the second supply node 6, 7, 8. The half-bridge arrangement may be configured to drive a load (not specifically illustrated) at an output node 3, 4, 5 of the half-bridge arrangement. The load may be an inductive load, for example. The output node 3, 4, 5 is electrically connected to a common node between the high-side switch S1 and the low-side switch S2.

In the circuit arrangement of FIG. 2, each switch S1, S2 of the half-bridge arrangement is implemented as an IGBT (insulated-gate bipolar transistor). This, however, is only an example. The switches S1, S2 may also he implemented as MOSFETs (Metal Oxide Semiconductor Field-Effect Transistor), JFETs (Junction Field Effect Transistor), HEMTs (High Electron Mobility Transistor), BJTs (Bipolar Junction Transistor), or any other kind of transistor, for example. Each of the switches S1, S2 may comprise an internal or external freewheeling diode. According to another example, each of the switches S1, S2 comprises two or more separate switching elements electrically coupled in parallel to each other (not illustrated).

Each of the first switch S1 and the second switch S2 includes a control electrode 10, 14 and a controllable load path between a first load electrode and a second load electrode. The load paths of the first switch S1 and the second switch S2 are coupled in series and between the first supply node 1, 2, 9 and the second supply node 6, 7, 8.

Several different connection terminals may be provided in order to electrically contact the half-bridge arrangement according to the example of FIG. 2. According to one example, three different first terminals 1, 2, 9 may be provided to form the first supply node, and three different second terminals 6, 7, 8 may be provided to form the second supply node. A third terminal 10 may be provided to form the control electrode of the first switch S1, and a fourth terminal 14 may be provided to form the control electrode of the second switch S2. Three fifth terminals 3, 4, 5 may be provided to form the output node of the half-bridge arrangement.

Further, emitter terminals 12, 13 as well as so-called auxiliary emitter terminals 11, 15 may be provided for each of the first switch S1 and the second switch S2. Auxiliary emitter terminals 11, 15 may be provided, e.g., in order to minimize potentially negative feedback effects on the gate-emitter voltage (gate-emitter voltage=voltage between control electrode 10, 14 and corresponding emitter terminal 12, 13 of a switch S1, S2). According to another example, the auxiliary emitter terminals 11, 15 may be provided in order to detect an internal voltage drop between an emitter terminal 12, 13 and a respective one of the auxiliary emitter terminals 11, 15 (e.g., voltage drop between terminals 11 and 12, or voltage drop between terminals 13 and 15). A voltage drop may occur, for example, due to a stray inductance in the moment of switching the corresponding first or second switch S1, S2 on or off. The detected voltage drop may be used for error detection, for example.

In this way, a total of, e.g., fifteen terminals may be provided for electrically contacting a single half-bridge arrangement. In a power semiconductor module arrangement 300, each of the individual terminals 1-15 may be implemented as a terminal element 34, as has been described with respect to FIG. 1 above. One or more terminals 1-15 may be electrically coupled to the same section of the first metallization layer 311. For example, the individual first terminals 1, 2, 9 may be electrically coupled to the same section of the first metallization layer 311, while the individual second terminals 6, 7, 8 may be electrically coupled to a different one of the sections of the first metallization layer 311. For example, two or more terminals that are electrically coupled to the same electrical potential may be electrically coupled to the same section of the first metallization layer 311. This, however, is only an example. It is also possible that two or more terminals that are electrically coupled to the same electrical potential are electrically coupled to two or more different sections of the first metallization layer 311. Such sections, however, may be electrically coupled to each other by means of bonding wires, connection plates or conductor rails, for example.

Now referring to FIGS. 1 and 2, the layout of the power semiconductor module arrangement, and in particular the position of the terminal elements 34 within the housing 37 may have an influence with regard to the switching behavior of the semiconductor arrangement. Therefore, the positions of the individual terminal elements 34 within the housing 37 may be chosen to comply with requirements concerning creepage distances and to improve the switching behavior of the half-bridge arrangement.

Figure 3:
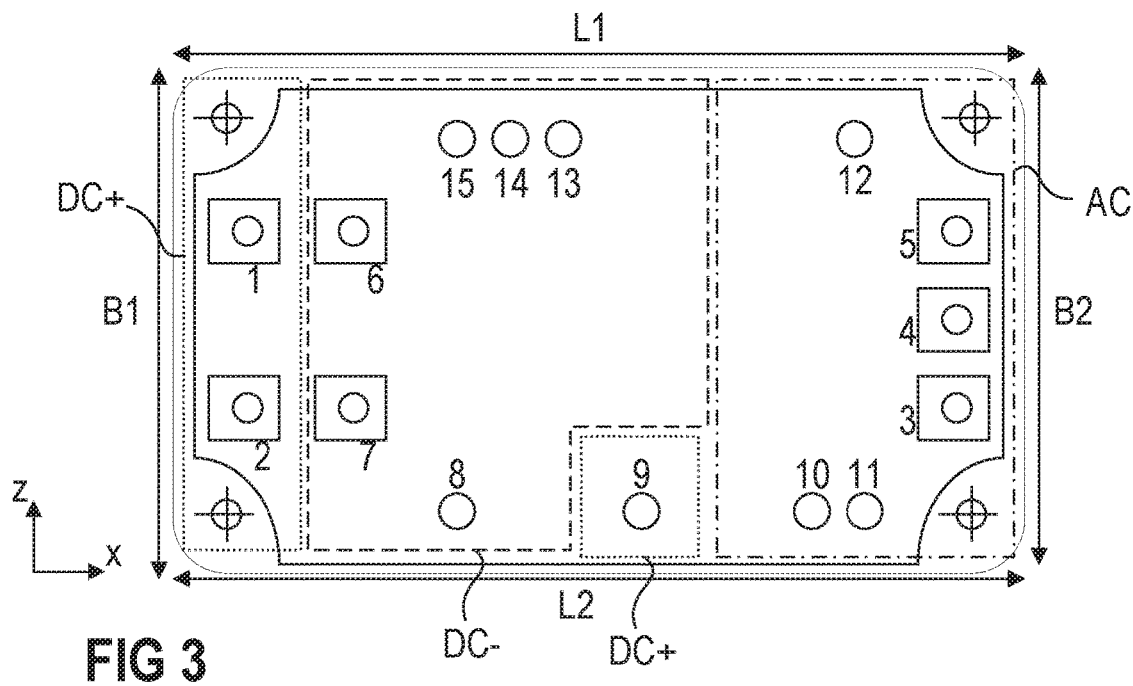
FIG. 3 schematically illustrates a top view of a power semiconductor module arrangement according to one example.

As is schematically illustrated in FIGS. 2 and 3, the individual terminals may be grouped according to their electrical potentials. That is, the first terminals 1, 2, 9 that are electrically connected to the first electrical potential DC+ may form a first group (dotted line in FIGS. 2 and 3), the second terminals 6, 7, 8 as well as the second emitter and second auxiliary emitter terminals 13, 15 that are electrically connected to the second electrical potential DC− may form a second group (dashed line in FIGS. 2 and 3), and the output terminals 3, 4, 5 as well as the first emitter and first auxiliary emitter terminals 12, 11 that are electrically connected to the output potential AC may form a third group (dot-dashed line in FIGS. 2 and 3). The control terminal 10 of the first switch S1 may be included in the third group AC, and the control terminal 14 of the second switch S2 may be included in the second group DC−, for example.

The terminals of a certain group may be arranged adjacent or at least close to each other, with no or as few as possible other terminals of another group arranged therebetween. The power semiconductor module arrangement 300, in particular the semiconductor substrate 310 and the housing 37 may have a rectangular form, for example. That is, the power semiconductor module arrangement 300 may comprise a first longitudinal side L1, a second longitudinal side L2, a first narrow side B1 and a second narrow side B2. As is schematically illustrated in the top view of FIG. 3, the terminals 3, 4, 5, 10, 11, 12 of the third group AC may be arranged within a third section of the power semiconductor module arrangement 300, wherein the third section is arranged along the second narrow side B2. The terminals 1, 2, 9 of the first group DC+ may be at least partly arranged within a first section of the power semiconductor module arrangement 300, wherein the first section is arranged along the first narrow side B1. In the example illustrated in FIG. 3, only two of the terminals of the first group DC+ are arranged in the first section along the first narrow side B1. The terminals 6, 7, 8, 13, 14, 15 of the second group DC− may be arranged within a second section of the power semiconductor module arrangement 300, wherein the second section is arranged between the first section and the third section. The second section adjoins the first longitudinal side L1 and the second longitudinal side L2, but does not adjoin the first and the second narrow sides B1, B2. That is, in the first horizontal direction x, the second section is bordered by the first section to one side and by the third section to the opposite side.

The first emitter terminal 12 is arranged closer to the third terminals 3, 4, 5 than to the second control terminal 14, the second emitter terminal 13, and the second auxiliary emitter terminal 15. A distance between the first control terminal 10 and the first terminal 9 that is arranged in the fourth section essentially equals a distance between the first terminal 9 that is arranged in the fourth section and a third one of the second terminals 8 which is arranged adjacent to the second longitudinal side L2.

As is schematically illustrated in FIG. 3, it may not be possible to arrange all terminals 1, 2, 9 of the first group within the same section. Therefore, at least one terminal 9 of the first group may be arranged separately within a fourth section. The fourth section may adjoin the second longitudinal side L2 and may be arranged between the second section and the third section in the first horizontal direction x, for example. The fourth section, however, may not adjoin the first longitudinal side L1. In a second horizontal direction z, a part of the second section may be arranged between the fourth section and the first longitudinal side L1.

In this way, the terminals 1-15 are grouped according to the potential they are electrically connected to. This allows for contacting and controlling the power semiconductor module arrangement 30 as symmetrically as possible. Further, any requirements concerning creepage distances may he fulfilled. Due to the grouping of the terminals according to their electrical potential, the surface area of the semiconductor substrate 310 may be exploited optimally. Conductor tracks (sections of the first metallization layer 311) may be kept as short as possible, as all terminals contacting a certain conductor track are arranged within a certain range to each other with no terminals of other electric potentials arranged in between.

A voltage drop between terminals that are electrically connected to the same electric potential (e.g., terminals 5 and 12, both electrically connected to the third electric potential AC) may be significantly less (e.g., several Volts) than a voltage drop (e.g., several 10s of Volts) between terminals that are electrically connected to different electric potentials (e.g., terminal 12 electrically connected to the third electric potential AC, and terminal 13 electrically connected to the second electric potential DC−). Arranging terminals that are connected to the same electric potential adjacent to each other, therefore, provides several advantages over arrangements wherein a plurality of terminals that are electrically connected to different electric potentials are arranged adjacent to each other.

For example, terminals 11 and 12 are both electrically connected to the third electrical potential AC, and terminals 8 and 15 are both electrically connected to the second electrical potential DC−. An internal de-concentration of these pairs of terminals results in a different routing of the conductor tracks on the semiconductor substrate 310. A different routing of the conductor tracks may lead to different internal inductances. Any differences of the inductances may be compensated by a meander-shaped routing of the conductor tracks, for example.

Within the individual first, second and third sections, the respective terminals may be arranged in the periphery along the sides of the respective sections. That is, within the first section DC+, the terminals 1, 2 may be arranged along the first narrow side B1, wherein one terminal 1 is arranged adjacent to the first longitudinal side L1 (significantly closer to the first longitudinal side L1 than to the second longitudinal side L2), and another terminal 2 is arranged adjacent to the second longitudinal side L2 (significantly closer to the second longitudinal side L2 than to the first longitudinal side L1). Within the second section DC−, a first sub-group of terminals 13, 14, 15 is arranged along the first longitudinal side L1 (significantly closer to the first longitudinal side L1 than to the second longitudinal side L2), a second sub-group of terminals 8 is arranged along the second longitudinal side L2 (significantly closer to the second longitudinal side L2 than to the first longitudinal side L1), and a third sub-group of terminals 6, 7 is arranged along a border of the second section DC− towards the first section DC+. Within the third sub-group, one terminal 6 is arranged adjacent to the first sub-group and the first longitudinal side L1 (significantly closer to the first longitudinal side L1 than to the second longitudinal side L2), and another terminal 7 is arranged adjacent to the second sub-group and the second longitudinal side L2 (significantly closer to the second longitudinal side L2 than to the first longitudinal side L1). No terminals may be arranged in a central portion of the second section. Within the third section AC, a fourth sub-group of terminals 3, 4, 5 may be arranged along the second narrow side B2 (closer to the second narrow side B2 than to the first narrow side B1), a fifth sub-group 10, 11 may be arranged along the second longitudinal side L2 (closer to the second longitudinal side L2 than to the first longitudinal side L1), and a sixth sub-group 12 may be arranged along the first longitudinal side L1 (closer to the first longitudinal side L1 than to the second longitudinal side L2). No terminals may be arranged in a central portion of third section. Each sub-group may comprise at least one terminal.

Figure 5:
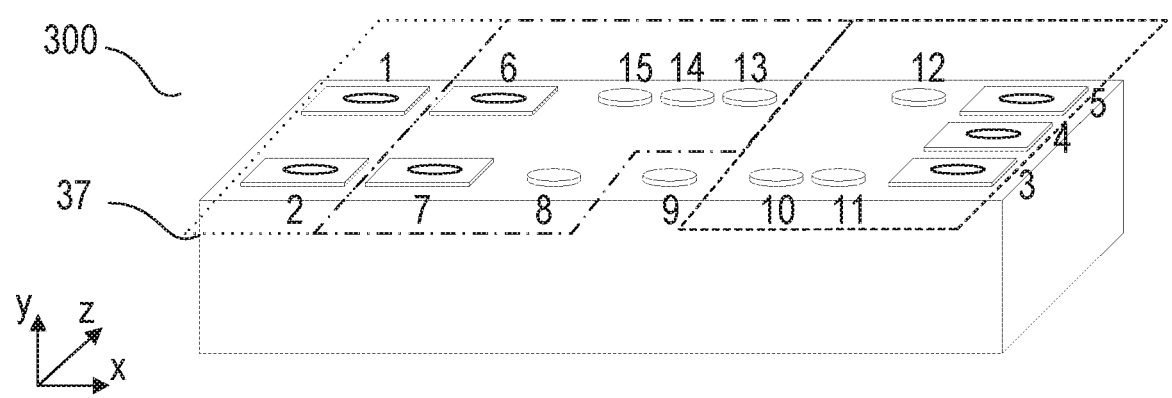
FIG. 5 schematically illustrates a three-dimensional view of a power semiconductor module arrangement according to one example.

FIG. 5 schematically illustrates a three-dimensional view of a power semiconductor module arrangement 300 comprising a housing 37, wherein the terminal elements 34 (terminals 1-15) are cumulated in three main groups, as has been described with respect to FIG. 3 above. The semiconductor substrate 310 and the semiconductor bodies 320 mounted thereon are not visible in the three-dimensional view of FIG. 5, because any components that are arranged inside the housing 37 are not visible through the sidewalls and the top cover of the housing 37.

Arranging one (see terminal 9 in FIG. 3) or more (not illustrated) terminals connected to a certain electrical potential distant to other terminals connected to the same potential may be necessary in few cases for reasons of space, for example. This, however, may be acceptable for many applications if the majority of terminals is arranged in three main groups according to their potential (see groups DC+, DC−, AC in FIG. 3).

Arranging the terminals in at least three main groups, as has been described with respect to FIG. 3 above, provides an optimized layout with respect to a parallel connection of two or more power semiconductor module arrangements 300. This is exemplarily illustrated in FIG. 4. In the top view illustrated in FIG. 4, two power semiconductor module arrangements 300 are connected in parallel to each other. As can be seen, with the arrangement of the terminals in at least three main groups, as has been described with respect to FIG. 3 above, all terminals 3, 4, 5, 10, 11, 12 electrically connected to the third potential AC may be arranged along one side of the parallel connection. All terminals 1, 2 electrically connected to the first potential DC+ may be at least partly arranged along an opposite side of the parallel connection of power semiconductor module arrangements 300. All terminals 6, 7, 8, 13, 14, 15 electrically connected to the second potential DC− may be arranged centrally between the first side and the second side. A remaining terminal 9 electrically connected to the first electric potential DC+ may form a fourth group and may be arranged centrally between the first side and the second side.

Figure 4:
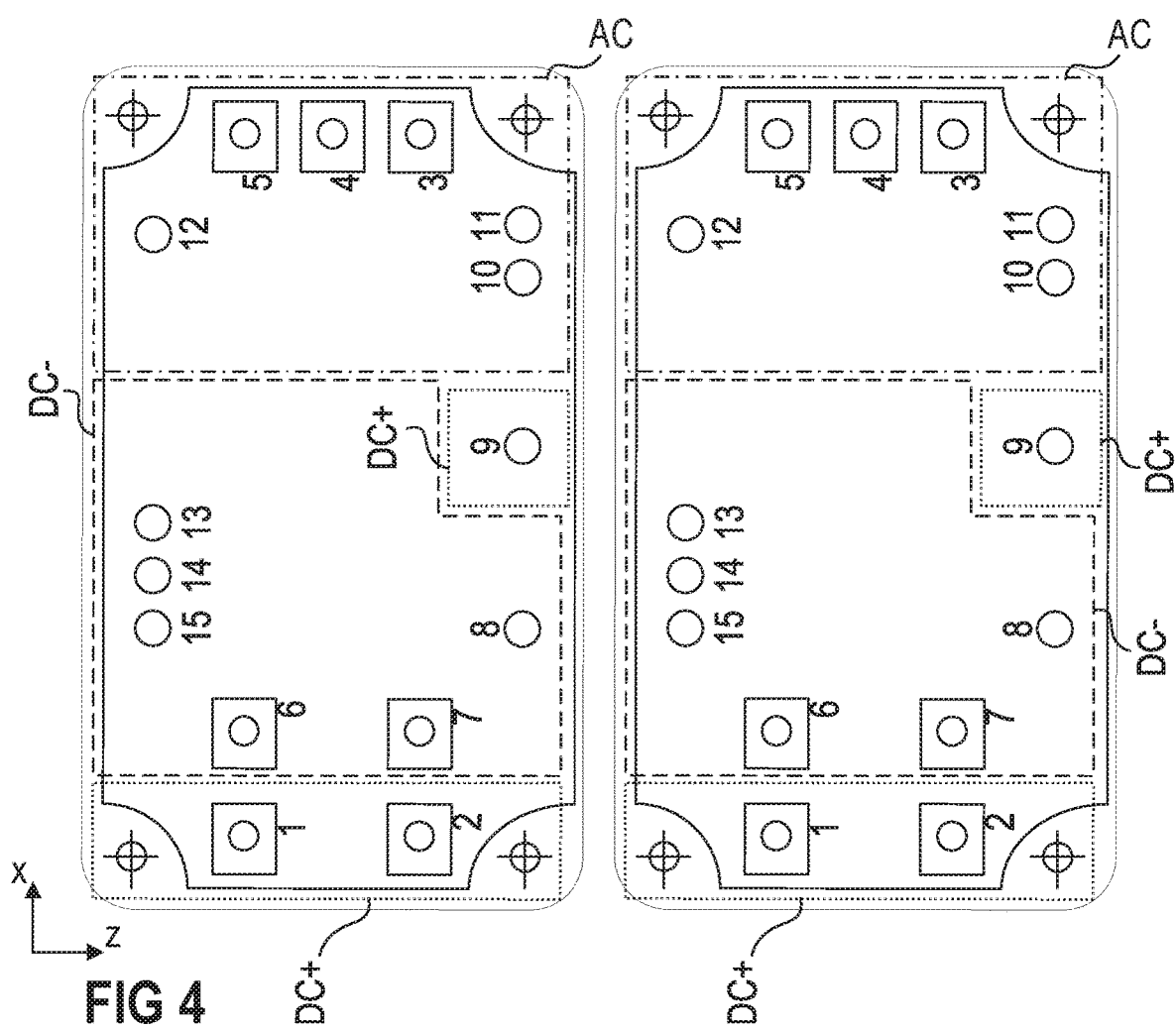
FIG. 4 schematically illustrates a top view of a power semiconductor module arrangement according to another example.

As has been described with respect to FIG. 1 above, a terminal element 34 may comprise a second end 341 which extends outside the housing 37. Each of the second ends 341 may form a connection plate outside the housing 37. In the Figures, some terminals 1, 2, 3, 4, 5, 6, 7 are illustrated as comprising connection plates, for example. The connection plates may be arranged essentially parallel to a top surface of the semiconductor substrate 310 that is arranged inside the housing 37. Such connection plates may comprise a threaded hole, for example (in FIGS. 3 to 5 schematically illustrated as circle inside the second ends 341 of the terminal elements 34 of terminals 1, 2, 3, 4, 5, 6, 7). The terminal elements 34 may be electrically contacted by means of electrically conductive screws, for example (screws not illustrated in the Figures). Such electrically conductive screws may be inserted into the threaded holes. Any external elements (not illustrated) may be mechanically and electrically coupled to the terminals elements 34 by means of such screws.

In the Figures, other terminals 8, 9, 10, 11, 12, 13, 14, 15 are illustrated as comprising contact pins which protrude vertically from the inside to the outside of the housing 37. The contact pins may comprise a threaded hole, for example (in FIGS. 3 to 5 the threaded holes of terminals 8, 9, 10, 11, 12, 13, 14, 15 are not specifically illustrated). The terminal elements 34 that are implemented as contact pins may also be electrically contacted by means of electrically conductive screws, for example (screws not illustrated in the Figures). Such electrically conductive screws may be inserted into the threaded holes. Any external elements (not illustrated) may be mechanically and electrically coupled to the terminals elements 34 by means of screws. External elements may comprise at least one of connection plates, circuit boards, and connection wires, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
    a first switching element and a second switching element, each having a control terminal and a controllable load path between two load terminals, the load path of the first switching element and the load path of the second switching element being operatively coupled in series and between a first supply node which is configured to be operatively coupled to a first electrical potential, and a second supply node which is configured to be operatively coupled to a second electrical potential, wherein the first switching element and the second switching element are connected with each other via a first common node; and
    an output node configured to be coupled to an output potential, the output node being coupled to the first common node,
    wherein the first supply node is formed by a plurality of first terminals,
    wherein the second supply node is formed by a plurality of second terminals,
    wherein the output node is formed by a plurality of third terminals,
    wherein a first auxiliary emitter terminal of the first switching element is electrically coupled to the control terminal of the first switching element,
    wherein a second auxiliary emitter terminal of the second switching element is electrically coupled to the control terminal of the second switching element,
    wherein the first switching element and the second switching element are arranged inside a housing, the housing comprising a first longitudinal side, a second longitudinal side, a first narrow side, and a second narrow side,
    wherein the first terminals are at least partly arranged in a first section of the housing adjacent to the first narrow side,
    wherein the third terminals, the first control terminal, a first emitter terminal and the first auxiliary emitter terminal are arranged in a third section of the housing adjacent to the second narrow side,
    wherein the second terminals, the second control terminal, a second emitter terminal, and the second auxiliary emitter terminal are arranged in a second section of the housing which is arranged between the first section and the third section.

2. The power semiconductor module arrangement of claim 1, wherein one of the first terminals is arranged in a fourth section of the housing distant to the first section.

3. The power semiconductor module arrangement of claim 2, wherein the fourth section is arranged adjacent to the second longitudinal side and to the second and third sections, and wherein the second section is arranged between the first section and the fourth section.

4. The power semiconductor module arrangement of claim 1, wherein the third terminals are arranged in one row along the second narrow side, wherein the first control terminal and the first auxiliary emitter terminal are arranged in one row along the second longitudinal side, wherein the first emitter terminal is arranged adjacent to the first longitudinal side, and wherein a central portion of the third section does not comprise any terminals.

5. The power semiconductor module arrangement of claim 1, wherein the second control terminal, the second emitter terminal, and the second auxiliary emitter terminal are arranged in one row along the first longitudinal side, wherein two of the second terminals are arranged in one row perpendicular to the first and the second longitudinal side and adjacent to the first section, and wherein a third one of the second terminals is arranged adjacent to the second longitudinal side.

6. The power semiconductor module arrangement of claim 1, wherein a voltage drop between a third one of the second terminals and the second auxiliary emitter terminal is indicative of an error condition of the power semiconductor module arrangement.

7. The power semiconductor module arrangement of claim 1, wherein a voltage drop between the first emitter terminal and the first auxiliary emitter terminal is indicative of an error condition of the power semiconductor module arrangement.

8. The power semiconductor module arrangement of claim 1, wherein the first emitter terminal is arranged closer to the third terminals than to the second control terminal, the second emitter terminal, and the second auxiliary emitter terminal.

9. The power semiconductor module arrangement of claim 1, wherein a distance between the first control terminal and the first terminal that is arranged in the fourth section equals a distance between the first terminal that is arranged in the fourth section and a third one of the second terminals.

10. The power semiconductor module arrangement of claim 1, wherein the first switching element comprises at least one IGBT, at least one MOSFET, at least one JFET, or at least one HEMT.

11. The power semiconductor module arrangement of claim 1, wherein the second switching element comprises at least one IGBT, at least one MOSFET, at least one JFET, or at least one HEMT.

* * * * *